(12) United States Patent
Zhang et al.

(10) Patent No.: US 10,950,722 B2
(45) Date of Patent: Mar. 16, 2021

(54) VERTICAL GATE ALL-AROUND TRANSISTOR

(71) Applicants: STMICROELECTRONICS, INC., Coppell, TX (US); INTERNATIONAL BUSINESS MACHINES CORPORATION, Armonk, NY (US)

(72) Inventors: John H. Zhang, Altamont, NY (US); Carl Radens, LaGrangeville, NY (US); Lawrence A. Clevenger, LaGrangeville, NY (US); Yiheng Xu, Hopewell Junction, NY (US)

(73) Assignees: STMICROELECTRONICS, INC., Coppell, TX (US); INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/588,337

(22) Filed: Dec. 31, 2014

(65) Prior Publication Data

US 2016/0190312 A1    Jun. 30, 2016

(51) Int. Cl.
*H01L 29/78* (2006.01)
*H01L 29/165* (2006.01)
(Continued)

(52) U.S. Cl.
CPC .. *H01L 29/7827* (2013.01); *H01L 21/823871* (2013.01); *H01L 21/823885* (2013.01);
(Continued)

(58) Field of Classification Search
CPC ........... H01L 29/66666; H01L 29/7827; H01L 29/78642
See application file for complete search history.

(56) References Cited

U.S. PATENT DOCUMENTS

| | | | | |
|---|---|---|---|---|
| 6,670,642 | B2 * | 12/2003 | Takaura | H01L 27/0688 257/302 |
| 7,052,941 | B2 * | 5/2006 | Lee | B82Y 10/00 257/E27.026 |

(Continued)

OTHER PUBLICATIONS

Ionescu A.M. & Heike, R. "*Tunnel Field-Effect Transistors as Energy-Efficient Electronic Switches*," Macmillan Publishers Limited (2011) Nature 479, 329-337 (Nov. 17, 2011) doi:10.1038/nature10679, Published online Nov. 16, 2011.

(Continued)

*Primary Examiner* — Anh D Mai
(74) *Attorney, Agent, or Firm* — Seed IP Law Group LLP

(57) ABSTRACT

Vertical GAA FET structures are disclosed in which a current-carrying nanowire is oriented substantially perpendicular to the surface of a silicon substrate. The vertical GAA FET is intended to meet design and performance criteria for the 7 nm technology generation. In some embodiments, electrical contacts to the drain and gate terminals of the vertically oriented GAA FET can be made via the backside of the substrate. Examples are disclosed in which various n-type and p-type transistor designs have different contact configurations. In one example, a backside gate contact extends through the isolation region between adjacent devices. Other embodiments feature dual gate contacts for circuit design flexibility. The different contact configurations can be used to adjust metal pattern density.

19 Claims, 7 Drawing Sheets

(51) Int. Cl.
*H01L 27/092* (2006.01)
*H01L 29/66* (2006.01)
*H01L 21/8238* (2006.01)

(52) U.S. Cl.
CPC .......... *H01L 27/092* (2013.01); *H01L 29/165* (2013.01); *H01L 29/66666* (2013.01)

(56) References Cited

U.S. PATENT DOCUMENTS

| | | | |
|---|---|---|---|
| 8,598,650 B2* | 12/2013 | Masuoka | H01L 27/0207 257/329 |
| 8,759,874 B1 | 6/2014 | Loubet et al. | |
| 9,385,195 B1* | 7/2016 | Zhang | H01L 29/1033 |
| 2003/0119237 A1* | 6/2003 | Chittipeddi | H01L 21/82388 438/199 |
| 2004/0192032 A1* | 9/2004 | Ohmori | H01L 21/76807 438/655 |
| 2005/0072988 A1* | 4/2005 | Augusto | H01L 21/823885 257/192 |
| 2008/0054313 A1* | 3/2008 | Dyer | G03F 9/7084 257/276 |
| 2009/0267233 A1* | 10/2009 | Lee | H01L 21/2007 257/758 |
| 2011/0303973 A1* | 12/2011 | Masuoka | H01L 21/26586 257/329 |
| 2013/0341596 A1 | 12/2013 | Chang et al. | |
| 2014/0175554 A1 | 6/2014 | Loubet et al. | |
| 2016/0087059 A1* | 3/2016 | Hsieh | H01L 21/823475 257/329 |
| 2017/0213836 A1* | 7/2017 | Zhang | H01L 27/10879 |

OTHER PUBLICATIONS

Björk, M.T. et al., "*Si-InAs Heterojunction Esaki Tunnel Diodes with High Current Densities*" IBM Research—Zurich, Applied Physics Letters, (2010) 97(16):163501-163501-3. DOI: 10.1063/1.3499365, Published online Oct. 18, 2010.

Liu, Qing et al., "Multi-Channel Gate-All-Around FET," U.S. Appl. No. 14/312,418 filed Jun. 23, 2014 (31 pgs.).

* cited by examiner

VERTICAL GATE ALL-AROUND TRANSISTOR

BACKGROUND

1. Technical Field

The present disclosure generally relates to various geometries for gate all-around transistor devices built on a silicon substrate and, in particular, to vertically oriented gate all-around transistors in which current flows in a direction transverse to the surface of the silicon substrate.

2. Description of the Related Art

Conventional integrated circuits incorporate planar field effect transistors (FETs) in which current flows through a semiconducting channel between a source and a drain, in response to a voltage applied to a control gate. The semiconductor industry strives to obey Moore's law, which holds that each successive generation of integrated circuit devices shrinks to half its size and operates twice as fast. As device dimensions have shrunk below 100 nm, however, conventional silicon device geometries and materials have experienced difficulty maintaining switching speeds without incurring failures such as, for example, leaking current from the device into the semiconductor substrate. Several new technologies emerged that allowed chip designers to continue shrinking gate lengths to 45 nm, 22 nm, and then as low as 14 nm. One particularly radical technology change entailed re-designing the structure of the FET from a planar device to a three-dimensional device in which the semiconducting channel was replaced by a fin that extends out from the plane of the substrate. In such a device, commonly referred to as a FinFET, the control gate wraps around three sides of the fin so as to influence current flow from three surfaces instead of one. The improved control achieved with a 3-D design results in faster switching performance and reduced current leakage. Building taller devices has also permitted increasing the device density within the same footprint that had previously been occupied by a planar FET. Examples of FinFET devices are described in further detail in U.S. Pat. No. 8,759,874 and U.S. Patent Application Publication US2014/0175554, assigned to the same assignee as the present patent application.

The FinFET concept was further extended by developing a gate all-around FET, or GAA FET, in which the gate fully wraps around the channel for maximum control of the current flow therein. In the GAA FET, the channel can take the form of a cylindrical nanowire that is isolated from the substrate, in contrast to the peninsular fin. In the GAA FET the cylindrical nanowire is surrounded by the gate oxide, and then by the gate. Existing GAA FETs are oriented horizontally, such that the nanowire extends in a direction that is substantially parallel to the surface of the semiconductor substrate. GAA FETs are described in, for example, U.S. Patent Application Publication No. 2013/0341596 to Chang et al., of IBM and in U.S. patent application Ser. No. 14/312,418, assigned to the same assignee as the present patent application.

BRIEF SUMMARY

Vertical GAA FET structures are disclosed in which a current-carrying nanowire is oriented substantially perpendicular to the surface of a silicon substrate. The vertical GAA FET is intended to meet design and performance criteria for the 7 nm technology generation. In some embodiments, electrical contacts to the drain and gate terminals of the vertically oriented GAA FET can be made via the backside of the substrate. Examples are disclosed in which various n-type and p-type transistor designs have different contact configurations. In one example, a backside gate contact extends through the isolation region between adjacent devices. Other embodiments feature dual gate contacts for circuit design flexibility. The different contact configurations can be used to adjust metal pattern density.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale.

DETAILED DESCRIPTION

Figure 1:
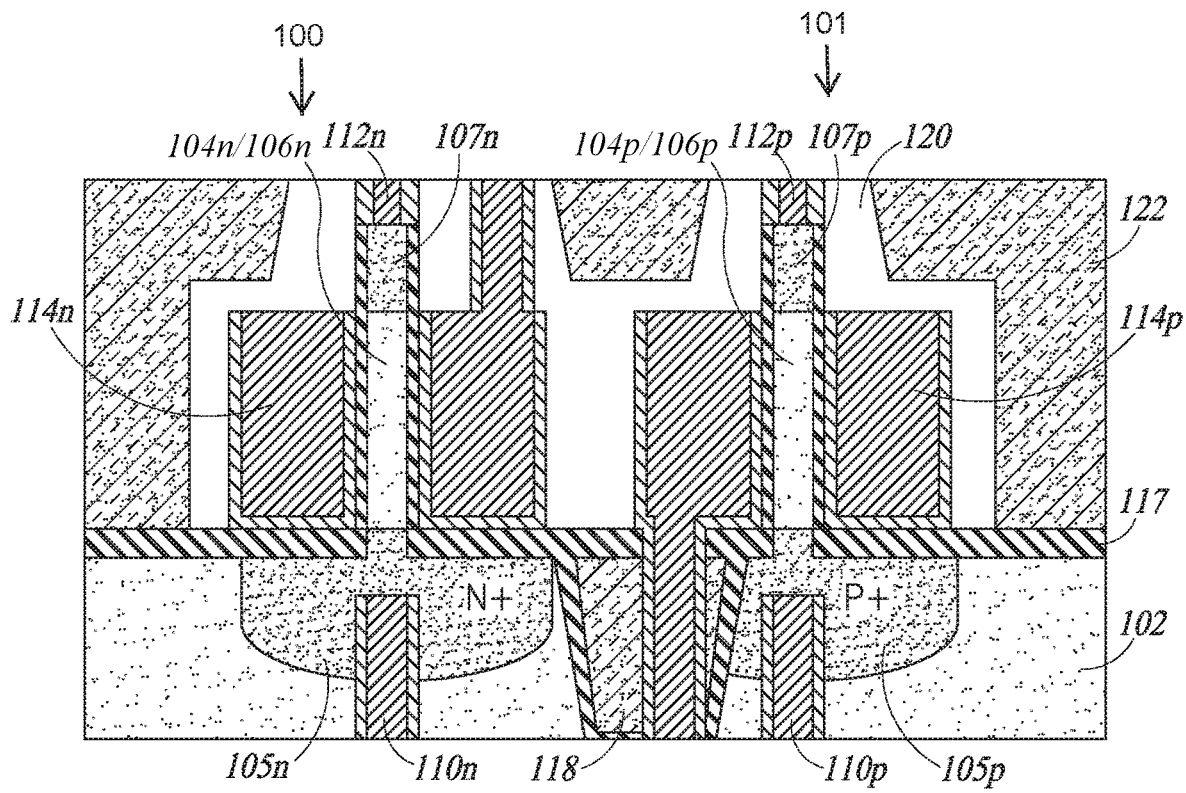
FIG. 1 is a cross-sectional view of n-type and p-type vertical gate-all-around (GAA) transistors, according to one embodiment described herein.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like and one layer may be composed of multiple sub-layers.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask (e.g., a silicon nitride hard mask), which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to vertical gate-all-around devices that have been produced; however, the present disclosure and the reference to certain materials, dimensions, and the details and ordering of processing steps are exemplary and should not be limited to those shown.

Turning now to the figures, FIGS. 1-4 show various different embodiments of vertical GAA transistors. FIG. 1 shows CMOS n-type and p-type vertical gate all-around (GAA) transistors, an n-FET device 100 and a p-FET device 101, respectively, built on a silicon substrate 102, according to one embodiment described herein. Each one of the vertical GAA transistors is essentially a linear, or 1-D device in the form of a nanowire 104 oriented in a direction transverse to planar front and back surfaces of the silicon substrate 102. Two such nanowires are shown in FIGS. 1, 104n and 104p. The nanowire 104n is the channel region of the n-FET device 100 and the nanowire 104p is the channel region of the p-FET device 101. The nanowire 104n includes a silicon channel 106n that couples an N+ drain 105n located below the channel 106n to an N+ source 107n located above the channel 106n along a channel axis 108; the nanowire 104p includes a SiGe channel 106p that couples a P+ drain 105p below the channel 106p to a P+ source 107p above the channel 106p. Alternatively, one or both channels can be made of a III-V semiconducting material such as InAs, as suggested by Ionescu and Riel in "Tunnel Field-Effect Transistors as Energy-Efficient Electronic Switches," [Nature, Vol. 479, November 17, 201, p. 379]. The vertical nanowire 104 desirably has a diameter in the range of 6-10 nm.

The n-type material in the source and drain of the n-FET device 100 can be, for example, epitaxially grown indium-doped silicon. The p-type material in the source and drain of the p-FET device 101 can be, for example, epitaxially grown SiGe. In one embodiment the channel length can be as long as 100 nm. A long channel length having an aspect ratio in the range of about 4:1-10:1 provides a high gate contact area to maintain low resistance contacts. Backside nanowire contacts 110n and 110p are also shown in FIG. 1, along with front side nanowire contacts 112n and 112p.

Metal gates 114 wrap around each of the nanowires 104. In one embodiment, the metal gates 114 include a stack of work function materials. For example, the metal gate for the n-FET device 100 is a three-layer stack that includes a 4-nm thick layer of titanium carbide (TiC) sandwiched between two 3-nm layers of titanium nitride (TiN). The metal stack for the p-FET device 101 is a three-layer stack of TiN that yields a total thickness of about 10 nm. The metal gates 114 are spaced apart from the channel by a wrap-around gate dielectric 115 made of a high-k material, e.g., $HfO_2$. The n-FET has a front side gate contact 116n and the p-FET has a backside gate contact 116p. Each contact contains a bulk metal and a liner, as is customary in the art. The gate contacts 116 are isolated from the source regions by a thick hard mask 117 made of silicon nitride (SiN) or silicon carbide (SiC).

The transistors 100 and 101 are separated by an isolation region 118 that is filled with an insulator, e.g., an oxide material with a silicon nitride liner. The backside gate contact 116p passes through the isolation region 118.

Finally, the nanowires 104 are covered by a low-k encapsulant 120, which is, in turn, covered, by an insulating material 122. In one embodiment, the low-k encapsulant 120 is made of SiOCN or SiBCN, having a thickness in the range of about 8-30 nm.

Comparing FIGS. 1-4, it becomes apparent that the different embodiments shown present alternative contact arrangements to the two nanowire devices, and in particular, alternative gate contact arrangements. The nanowires 104 and the geometries of the source/drain contacts 110 and 112 are substantially the same throughout FIGS. 1-4. However, the structure and placement of the various gate contacts 116 differs. For example, in FIG. 1, each device has a single gate contact, wherein the n-FET gate is accessible from the front side of the silicon, while the p-FET gate contact is accessible from the back side. Whereas, in the arrangement 102 shown in FIG. 2, each nanowire has a dual gate contact. For example, the n-FET gate 114n is accessible via two front side gate contacts 116n, while the p-FET gate 114p is accessible via two back side gate contacts 116p, each of which is disposed in an isolation region 118. A symmetric contact design in which an equal number of connections is made on the top side and the back side of the silicon maintains a balanced metal line pattern density. Maintaining consistent pattern density facilitates processes that are particularly sensitive to pattern uniformity such as photolithography and planarization processes. Another advantage of using back side contacts is that they can be large compared with front side contacts, for example 10-100 nm or larger, and can thus serve as heat sinks.

Figure 3:
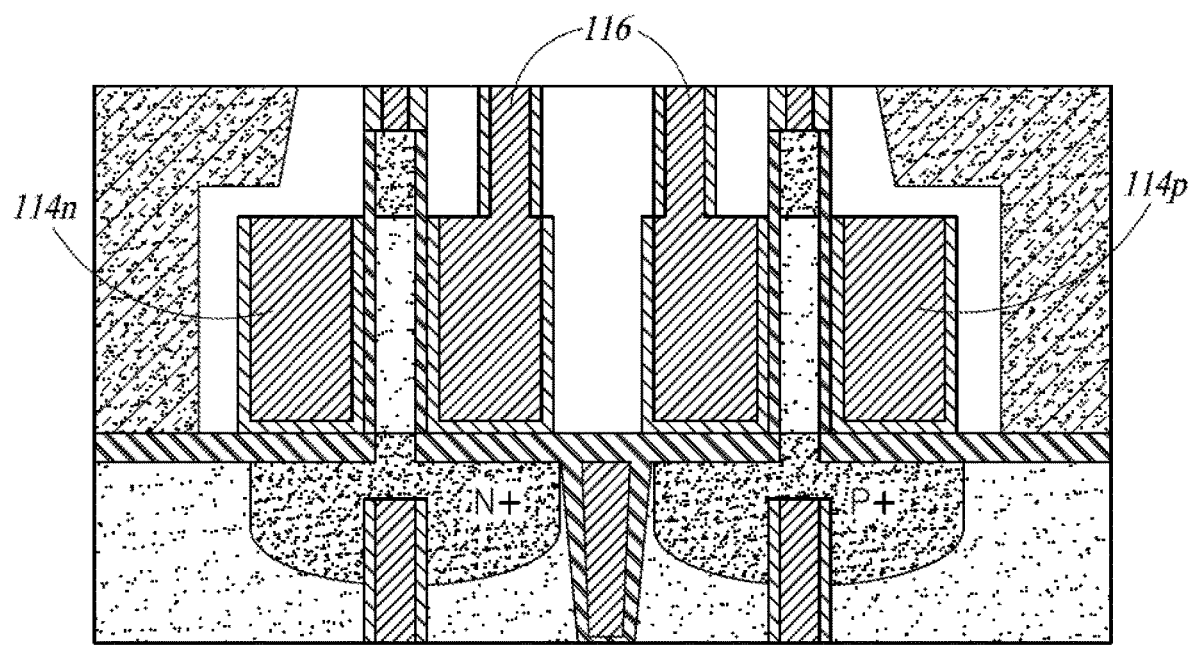

In FIG. 3, each transistor gate 114 is accessible by a single front side gate contact 116.

Figure 4:
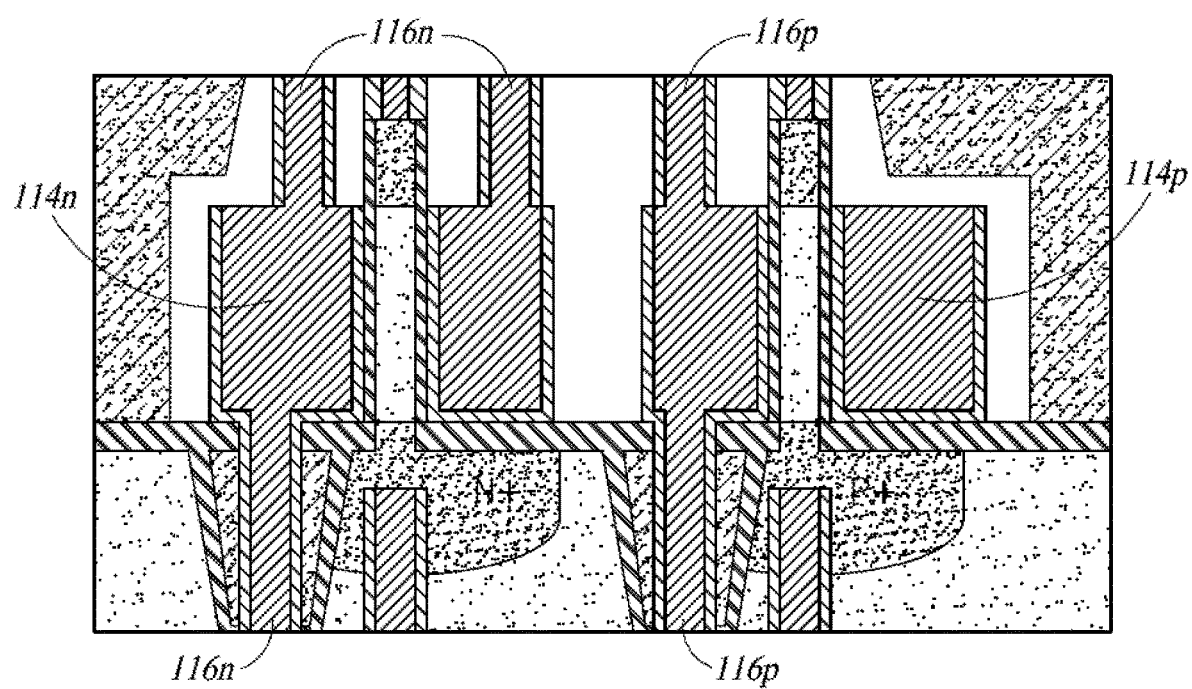

In FIG. 4, each transistor gate 114 is accessible by both a front side gate contact 116 and a backside gate contact 116. In addition, the n-FET has a dual front-side contact 116n. Providing more than one gate contact is helpful in the design of Boolean logic circuit applications, for example.

Figure 5:
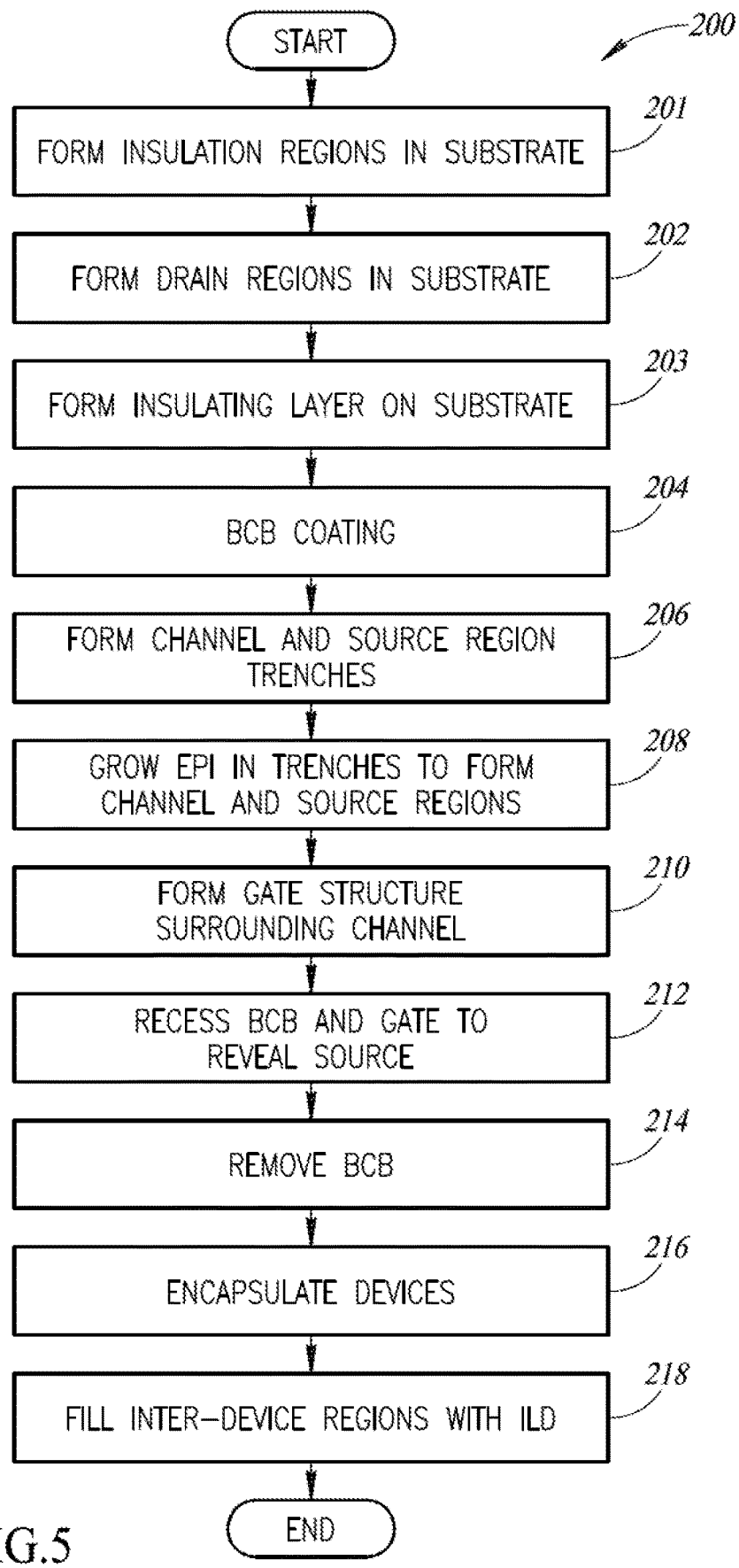
FIG. 5 is a flow diagram summarizing a sequence of processing steps that can be used to fabricate the vertical GAA transistors shown in FIGS. 1-4, according to a first exemplary embodiment described herein.

FIG. 5 shows steps in a method 200 of fabricating the vertical GAA transistors shown in FIG. 1, as an example. The method shown in FIG. 5 is further illustrated by FIGS. 6-10, and described below. The exemplary method 200 uses a technique that entails coating and removal of a sacrificial polymer material, for example, benzocyclobutene (BCB). An alternative method of fabrication may use a method known as inlay banding.

Figure 6:
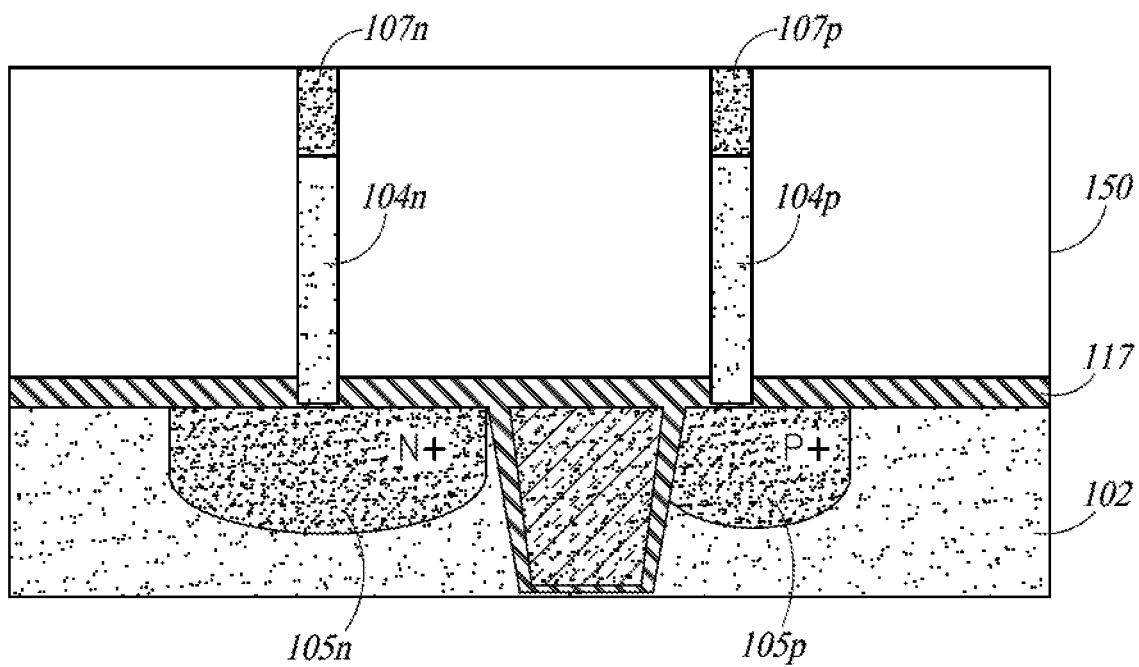
FIGS. 6-9 are cross-sectional views of the vertical GAA transistor configuration shown in FIG. 1, at various steps during the processing sequence shown in FIG. 5.

At 201, isolation regions are formed in the substrate 202 as shown in FIG. 6 by known methods.

At 202, drain regions are formed in the substrate 102, as shown in FIG. 6 by, for example, implant doping, in the usual way.

At 203, following an anneal step to drive the dopants to a desired depth, the insulating layer 117 is formed.

At 204, a first thick coating of the polymer BCB 150 is applied.

At 206, the BCB 150 is patterned using a reactive ion etch (RIE) process to form trenches for the nanowires 104. The trenches diameter is in the range of about 2-200 nm and the trench height is in the range of about 8-800 nm.

At 208, the channels 106 and then the source regions are formed by epitaxial growth within the high aspect ratio trenches, as shown in FIG. 6. The n-FET channel can be formed of silicon or indium arsenide (InAs), and the p-FET channel is formed of SiGe. The source regions can be formed by in-situ doping during epitaxy.

Figure 7:
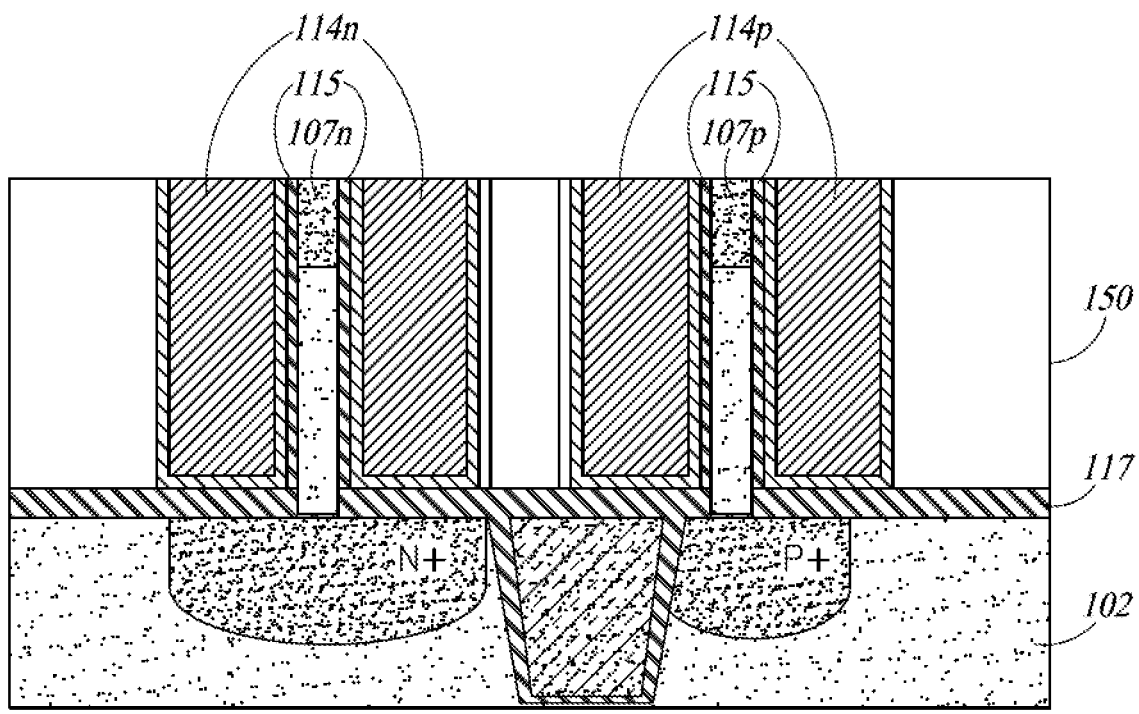

At 210, the metal gates 114n and 114p are formed, as shown in FIG. 7. First, a gate trench is formed using an RIE process that stops on the silicon nitride (SiN) layer 117. Then, the gate trenches are filled with the high-k wrap-around gate dielectric 115, a metal liner, one or more work function metals as discussed above, and then the metal gates 114 are polished to stop on the BCB 150.

At 212 The BCB 150 and the metal gates 114n and 114p are recessed, by selective etching, to reveal the source regions 107n and 107p.

Figure 8:
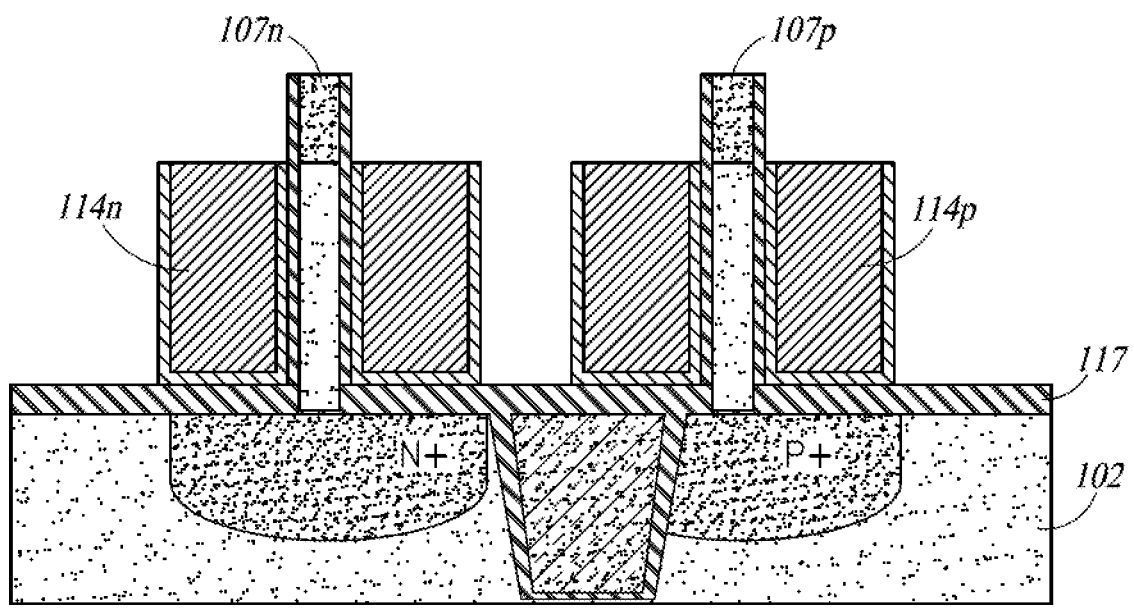

At 214, the BCB 150 is removed, as shown in FIG. 8. In addition, the high-k dielectric material 115 on the outsides of the metal gates 114 is removed. Some high-k material may remain on the exposed source regions 107.

At 216, the devices are encapsulated with the low-k encapsulant 120 for capacitance reduction.

Figure 9:
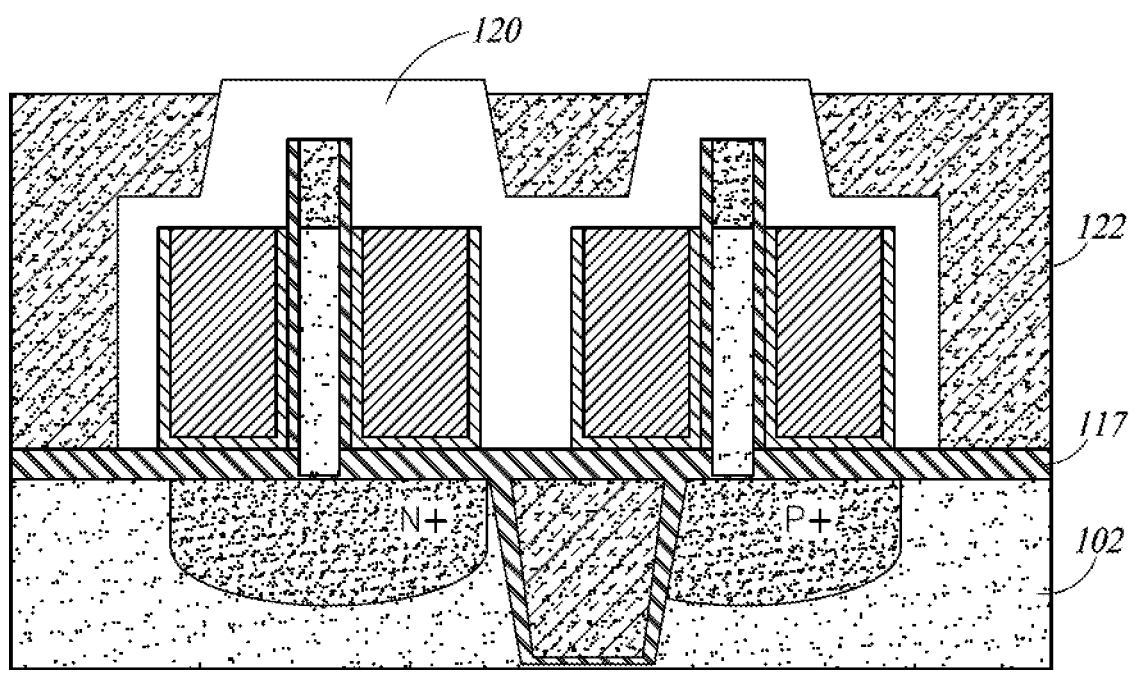

At 218, inter-device regions are filled with the inter-layer dielectric (ILD) 122, and the ILD 122 is then planarized to stop on the low-k encapsulant 120, as shown in FIG. 9.

Figure 2:
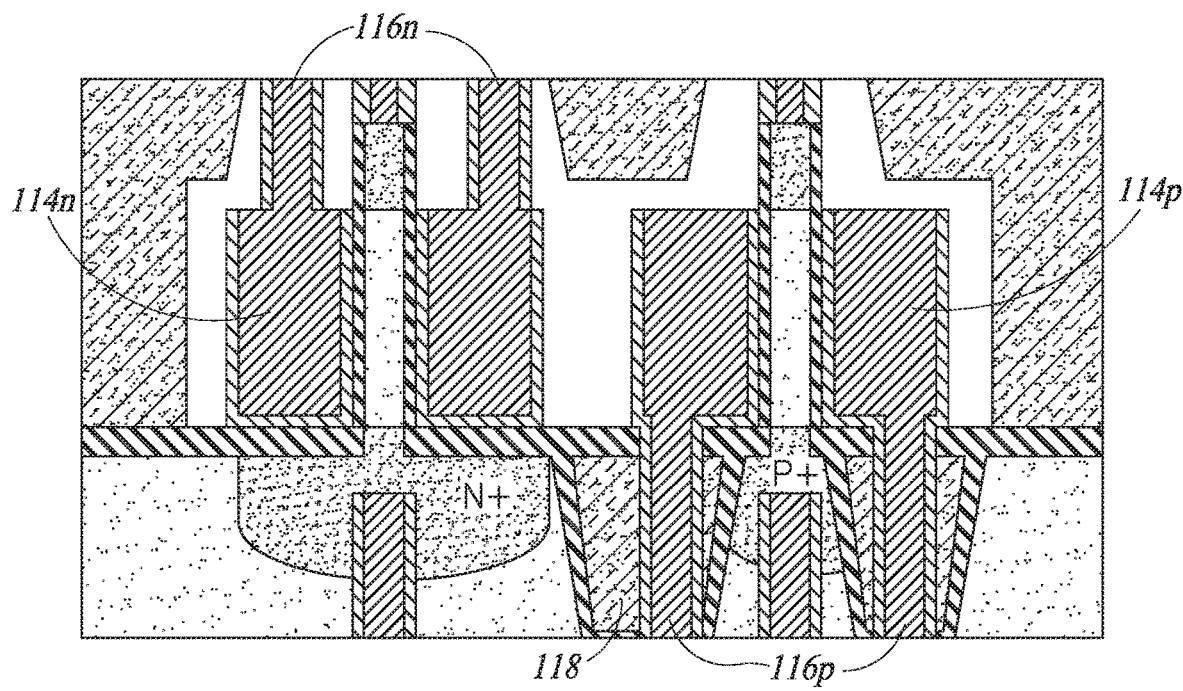
FIGS. 2-4 are cross-sectional views of alternative embodiments of the vertical GAA transistors shown in FIG. 1, wherein each embodiment has a different gate contact configuration, as described herein
Figure 10:
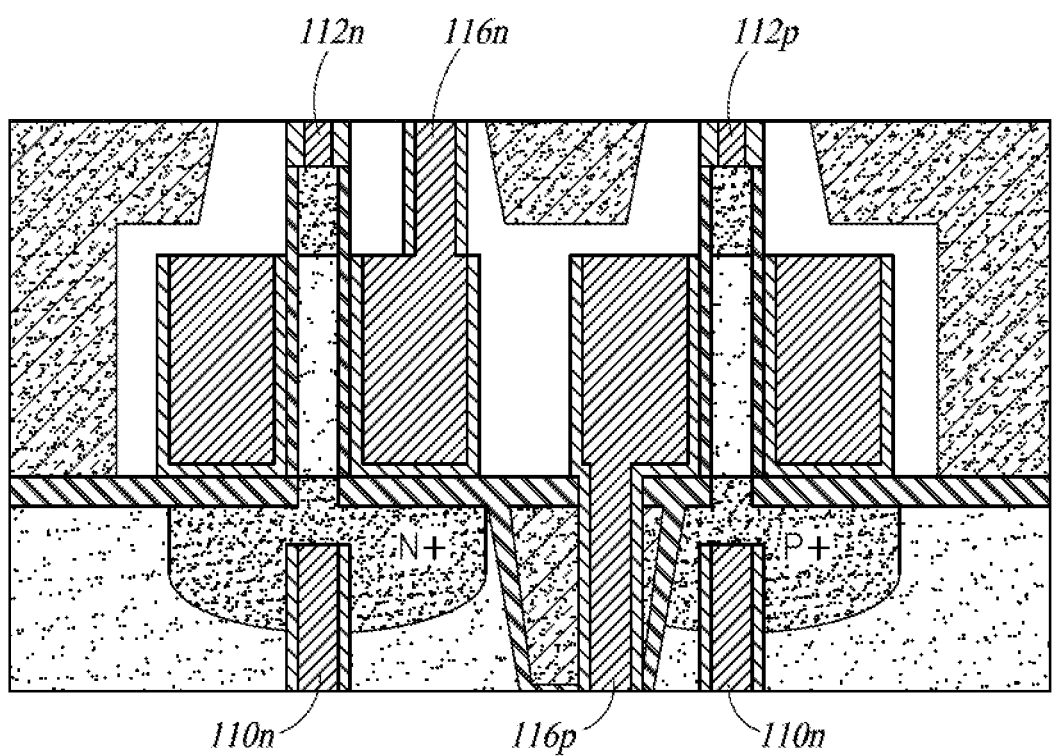
FIG. 10 is a cross-sectional view of completed n-type and p-type vertical gate-all-around (GAA) transistors having the gate contact configuration shown in FIG. 1, according to one embodiment described herein.

Opening contacts to the source, drain, and gate terminals of the n-FET and p-FET devices then produces the structure shown in FIG. 10, which is a reproduction of FIG. 1, or alternatively, the structures shown in FIGS. 2-4, which have different gate contact arrangements. The vertical geometry of the GAA transistors this formed allows flexibility in circuit design because it is possible to access the devices from different front side and back side locations by simply changing the contact configuration. For example, the NFET gate contact can extend from the front side, while the PFET gate contact can extend from the back side, or vice versa. One or more gate contacts can pass through isolation regions 118 for an even more compact design, as shown in FIGS. 1, 2, and 4.

Figure 11:
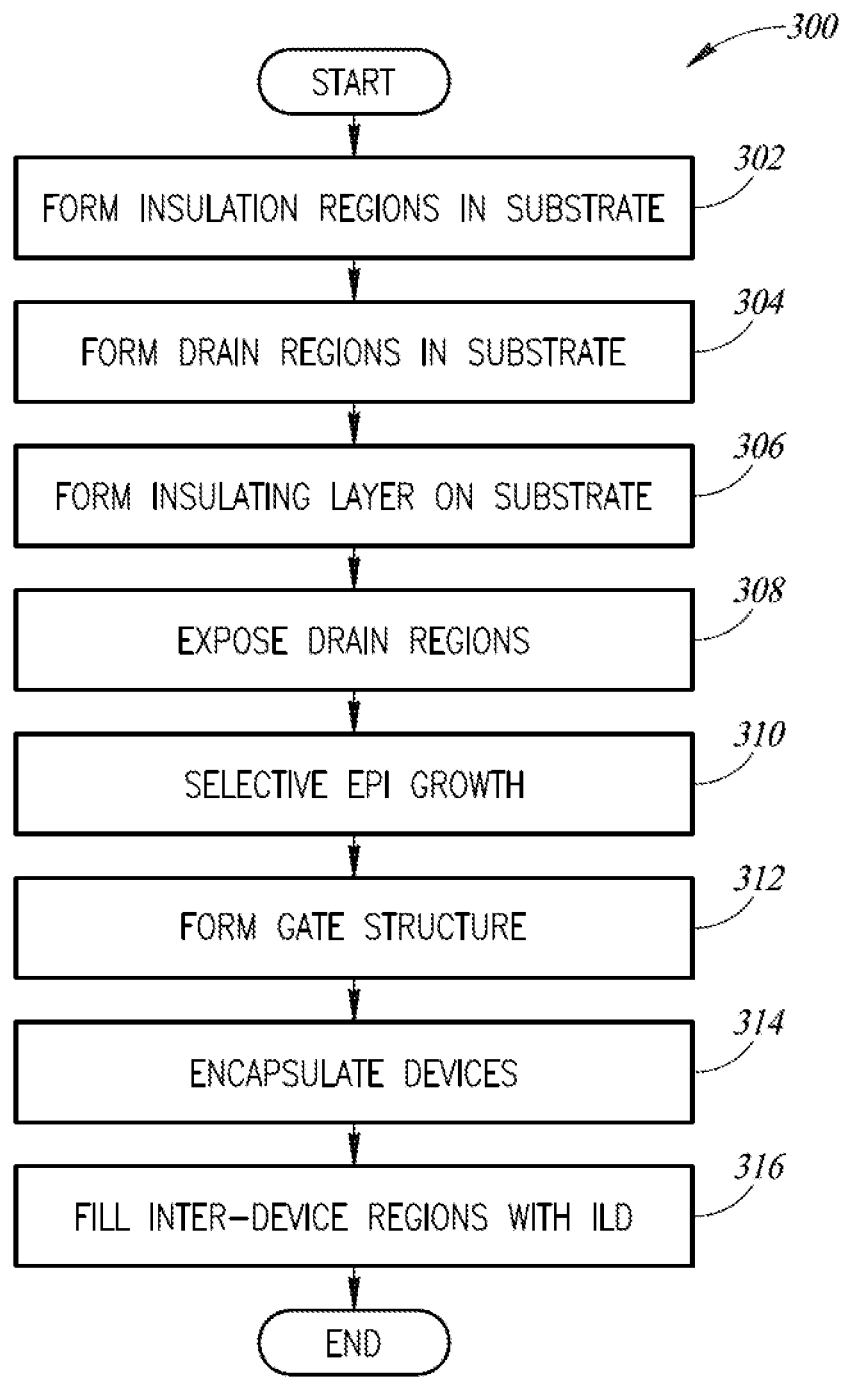
FIG. 11 is a flow diagram summarizing a sequence of processing steps that can be used to fabricate the vertical GAA transistors shown in FIGS. 1-4, according to a second exemplary embodiment described herein.

An alternative method 300 of fabricating the vertical GAA devices shown in FIGS. 1-4 is shown in FIG. 11, in accordance with methods described in a manuscript by Bjork et al. in "Si—InAs Heterojunction Esaki Tunnel Diodes with High Current Densities". Steps 302-306 of the method 300 are the same as steps 201-203 of FIG. 5.

Then, at 308-310, instead of forming trenches in a layer of BCB 150 and filling the trenches to form the nanowires 104, the drain regions are exposed at 308, and then at 310 vertical nanowires 104 are selectively grown from the drain regions 105. In one example, after opening the SiN layer 117 to expose the drain regions, selective nanowire growth is performed in an MOCVD system at 400-600 C and a reactor pressure of 60 Torr, using a trimethyl-indium (TMIn) and a tertiarybutyl-arsine molar flow of 0.7 µMol/min and 12.6 µMol/min, respectively to create InAs nanowires. Doping of the InAs is achieved by injecting disilane ($Si_2H_6$) during growth at $Si_2H_6$/TMIn ratios of 1E-6 to 1E-2.

At 312, once the nanowires 104 are in place, the metal gates 114 are formed by depositing the gate stack, including the high-k dielectric, the metal liner, the work function material, and the bulk metal gate layer, conformally over the nanowires 104, and etching away portions outside a desired radius from the nanowires 104. A BCB layer can then be used to mask the gate structure around the channel portions of the nanowires 104 while selectively etching gate stack material from the source region portions of the nanowires 104.

Steps 314-316 of the method 300 are the same as steps 216-218 of the method 200 described above.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

The invention claimed is:
1. A device, comprising:
a silicon substrate having a first surface and a second surface opposite the first surface;
an insulation region in the silicon substrate that extends between the first surface and the second surface and includes a liner layer of a first material and a second dielectric material laterally surrounded by the liner layer;
a first doped region in the silicon substrate between the first surface and the second surface;
a first conductive contact that extends from the second surface to the first doped region through a portion of the silicon substrate;
an insulating layer including the first material on the first doped region, the insulating layer having an opening, and the insulating layer overlapping the insulation region;
a semiconducting nanowire coupled to the first doped region through the opening, the semiconducting nanowire extending away from the first surface, the nanowire including a vertical channel;
a gate structure on the first surface surrounding the vertical channel, the gate structure including a gate dielectric including a second material on the insulating layer and the vertical channel, and a metal gate on the gate dielectric, the metal gate spaced from the insulating layer and the channel by the gate dielectric, the first and second materials being different from one another;
a second doped region on the nanowire spaced from the first surface by the nanowire, the gate structure being between the second doped region and the first surface; and
a gate contact in direct contact with the metal gate, the gate contact extending from a surface of the metal gate proximal to the silicon substrate into the insulation region in the silicon substrate, the insulation region laterally enveloped by silicon material of the silicon substrate.

2. The device of claim 1, further comprising:
an encapsulant around the gate structure and the nanowire; and
an inter-layer dielectric material around the encapsulant.

3. The device of claim 1 wherein the first material of the insulating layer comprises at least one of SiN and SiC, and the second material of the gate dielectric comprises $HfO_2$.

4. The device of claim 1, further comprising a low-k encapsulant in contact with the insulating layer and in contact with a side surface of the gate structure between the insulating layer and an upper surface of the gate structure.

5. The device of claim 1, further comprising:
a third doped region in the silicon substrate between the first surface and the second surface, the third doped region being spaced apart from the first doped region by the insulation region;
a second semiconducting nanowire coupled to the third doped region, the second semiconducting nanowire including a second vertical channel;
a second gate structure on the first surface of the silicon substrate and surrounding the second vertical channel; and
a second conductive contact in direct contact with the second gate structure, the second gate contact protruding away from the first surface of the silicon substrate.

6. A vertical field effect transistor, comprising:
a silicon substrate having a front surface and a back surface opposite the front surface;
a first doped region on the substrate spaced from the front surface of the substrate;
a second doped region in the silicon substrate, the second doped region extending into the substrate from the front surface, an edge of the second doped region being spaced from the back surface of the substrate;
a nanowire on the substrate extending between the first doped region and the second doped region, the nanowire including a channel located between the first doped region and the second doped region, the channel having a channel axis that is oriented transverse to the front surface of the silicon substrate;
an insulating layer on the front surface of the substrate, the insulating layer including a first material;
a gate, including:
a gate dielectric on the insulating layer and the channel, the gate dielectric including a second material that is different from the first material; and
a metal gate on the gate dielectric, the metal gate spaced apart from the insulating layer and the channel by the gate dielectric, wherein the gate wraps around the channel in the nanowire, the gate being positioned between the first doped region and the front surface of the substrate;
a first conductive contact coupled to the first doped region, the gate being spaced from the first conductive contact by the first doped region;
a second conductive contact coupled to the second doped region and extending from the back surface through the silicon substrate into the second doped region; and
a gate contact in direct contact with the metal gate, the gate contact extending from a surface of the gate proximal to the silicon substrate into a trench insulation region in the silicon substrate and through the insulation layer, the trench insulation region laterally enveloped by silicon material of the silicon substrate and including a liner layer of the first material and a second dielectric material surrounded by the liner layer and the insulation layer.

7. The transistor of claim 6 wherein the metal gate includes a multi-layer work function material including one or more of titanium, tungsten, titanium nitride, and titanium carbide, and the channel has a channel length as long as 100 nm.

8. The transistor of claim 6 wherein the channel includes a III-V semiconductor material.

9. The transistor of claim 6, further comprising a low-k encapsulant overlying and in contact with the gate, the low-k encapsulant including one or more of the silicon compounds SiOCN and SiBCN.

10. The transistor of claim 6, further comprising a low-k encapsulant overlying and in contact with the gate, the low-k encapsulant having a thickness in the range of about 8-30 nm.

11. The transistor of claim 6 wherein a metal density associated with the first conductive contact is balanced by an approximately equal metal density associated with a second electrical contact.

12. The transistor of claim 6 wherein the first material of the insulating layer comprises at least one of SiN and SiC, and the second material of the gate dielectric comprises $HfO_2$.

13. The transistor of claim 6 wherein the gate abuts the channel along an entire length of the channel between the first doped region and the second doped region.

14. The transistor of claim 6 wherein a portion of the second doped region extends through the insulating layer.

15. The transistor of claim 6, further comprising a low-k encapsulant in contact with the insulating layer and in contact with a side surface of the gate between the insulating layer and an upper surface of the gate.

16. A CMOS device, comprising:
- a substrate including a silicon layer having a front surface and a back surface opposite the front surface, the silicon layer having a first width in a first direction;
- an insulation layer over the front surface of the substrate and having a first dielectric material;
- a first vertical gate-all-around transistor, having:
  - a first doped region in the silicon layer;
  - a first channel on the front surface of the silicon layer;
  - a second doped region on the first channel and spaced from the silicon layer by the first channel;
  - a first gate on the silicon layer and around the first channel;
  - a first conductive contact coupled to the first gate and extending along a direction transverse to the front surface of the silicon layer, the first gate being between the first conductive contact and the silicon layer; and
  - a second conductive contact at the back surface of the silicon layer, the second conductive contact coupled to the first doped region, the first doped region having a second width in the first direction, the first width greater than the second width;
- a second vertical gate-all-around transistor, having:
  - a third doped region in the silicon layer;
  - a second channel on the front surface of the silicon layer;
  - a fourth doped region on the second channel and spaced from the silicon layer by the second channel;
  - a second gate on the silicon layer and around the second channel, the second gate spaced laterally apart from the first gate along the first direction;
  - a third conductive contact coupled to the second gate, the third conductive contact extending from a surface of the second gate proximal to the silicon layer of the substrate into an insulation region in the silicon layer, the insulation region laterally enveloped by silicon material of the silicon layer and including a liner layer of the first dielectric material and a second dielectric material surrounded by the liner layer and the insulation layer; and
  - a fourth conductive contact at the back surface of the silicon layer, the fourth conductive contact coupled to the third doped region, the third doped region having a third width in the first direction, the first width greater than the third width; and
- a low-k encapsulant on a first surface of the first gate and on a second surface of the second gate, the first and second surfaces respectively spaced apart from the silicon layer by the first gate and the second gate, the low-k encapsulant extending directly between and in contact with respective side surfaces of the first gate and the second gate which face each other, the low-k encapsulant filling an entire space between the first gate and the second gate along the first direction, the low-k encapsulant including one or more of the silicon compounds SiOCN and SiBCN,
- wherein the second conductive contact is spaced laterally apart from the fourth conductive contact, and the third conductive contact is disposed between the second conductive contact and the fourth conductive contact.

17. The device of claim 16 wherein the insulation region extends between the front surface and the back surface of the silicon layer.

18. The device of claim 16 wherein the first channel has a first channel axis, the second channel has a second channel axis, the second conductive contact has a first contact axis through a center of the second conductive contact, and the fourth conductive contact has a second contact axis through a center of the fourth conductive contact, the first channel axis being collinear with the first contact axis, and the second channel axis being collinear with the second contact axis.

19. The CMOS device of claim 16, further comprising an inter-layer dielectric on the low-k encapsulant.

* * * * *